United States Patent [19]

Dennis et al.

[11] Patent Number: 4,767,338

[45] Date of Patent: Aug. 30, 1988

[54] PRINTED CIRCUIT BOARD TELEPHONE INTERFACE

[76] Inventors: Melburn W. Dennis, P.O. Box 70, Alexander Rd, Ashville, N.Y. 14710; Gene A. Long, 8561 Falls Rd., West Falls, N.Y. 14170

[21] Appl. No.: 40,348

[22] Filed: Apr. 20, 1987

[51] Int. Cl.$^4$ ............................................. H01R 9/09
[52] U.S. Cl. ......................................... 439/55; 439/76
[58] Field of Search ...................... 439/43, 52, 55, 76, 439/547, 536, 537

[56] References Cited

U.S. PATENT DOCUMENTS

| Re. 31,714 | 10/1984 | Knickerbocker | 339/97 P |
|---|---|---|---|
| 3,836,942 | 9/1974 | Knickerbocker | 339/97 R |
| 4,595,799 | 6/1986 | Krob et al. | 439/55 |
| 4,641,900 | 2/1987 | Japngie | 439/76 |

*Primary Examiner*—Gil Weidenfeld
*Assistant Examiner*—Paula A. Austin
*Attorney, Agent, or Firm*—Webb, Burden, Ziesenheim & Webb

[57] ABSTRACT

The telephone interface includes a printed circuit board having input and output telephone receptacles connected to one surface of the printed circuit board and spaced apart from each other. The receptacles each have a plurality of pins connected to corresponding mounting plugs of the printed circuit board. A plurality of electrical traces extend along at least one surface of the printed circuit board and electrically connect the mounting plugs associated with the input receptacle to the mounting plugs associated with the output receptacle. The electrical traces are arranged in a predetermined pattern in which the pins of the input receptacle are connected to the pins of the output receptacle in a predetermined electrical circuit arrangement.

35 Claims, 6 Drawing Sheets

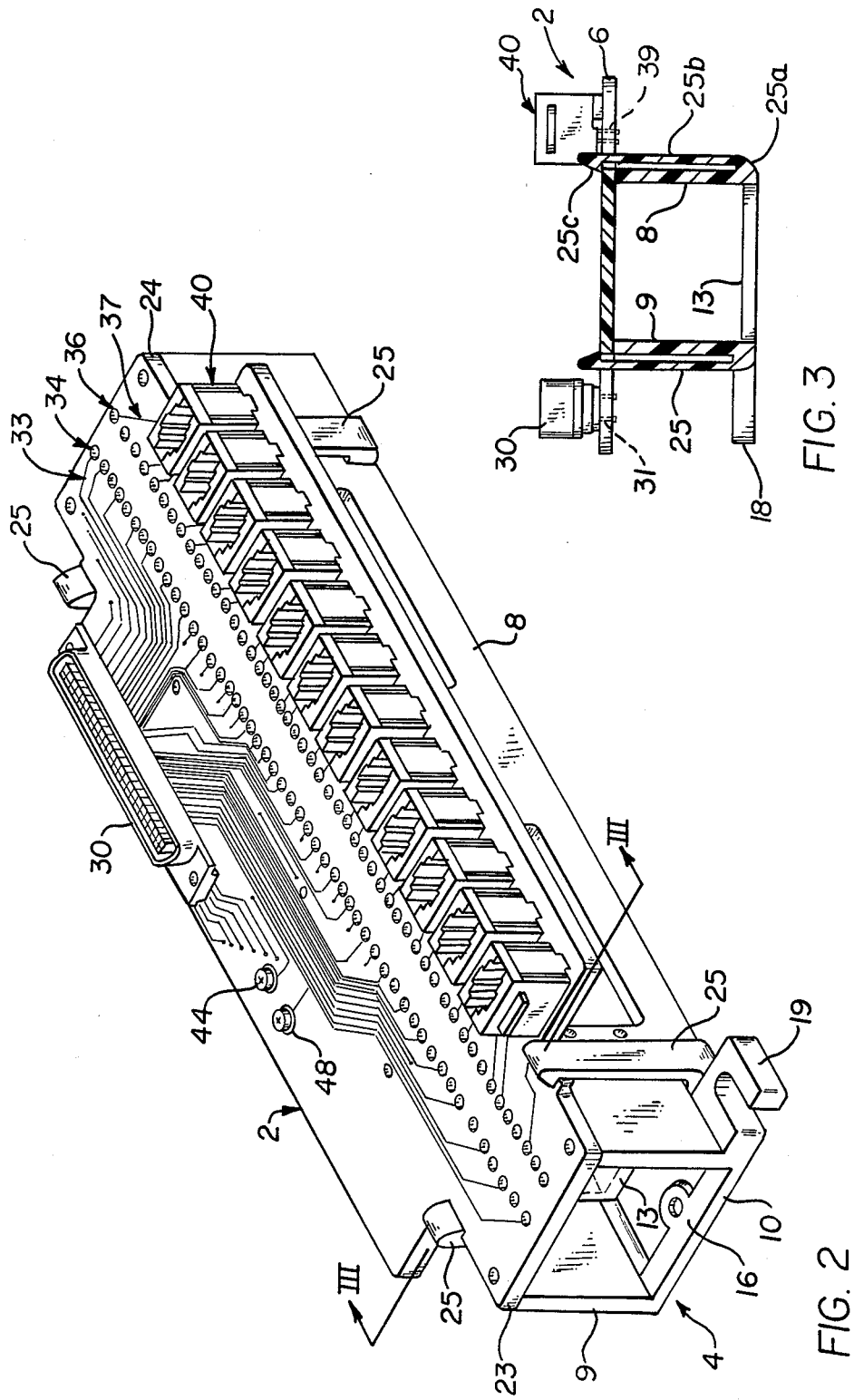

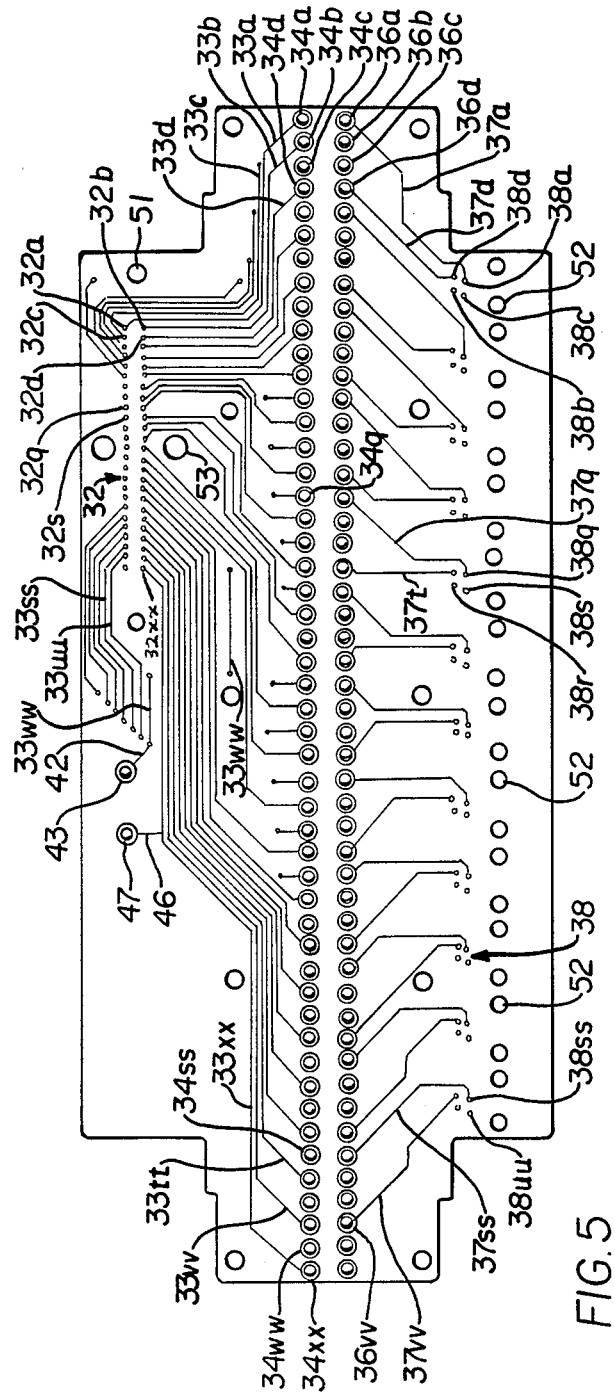
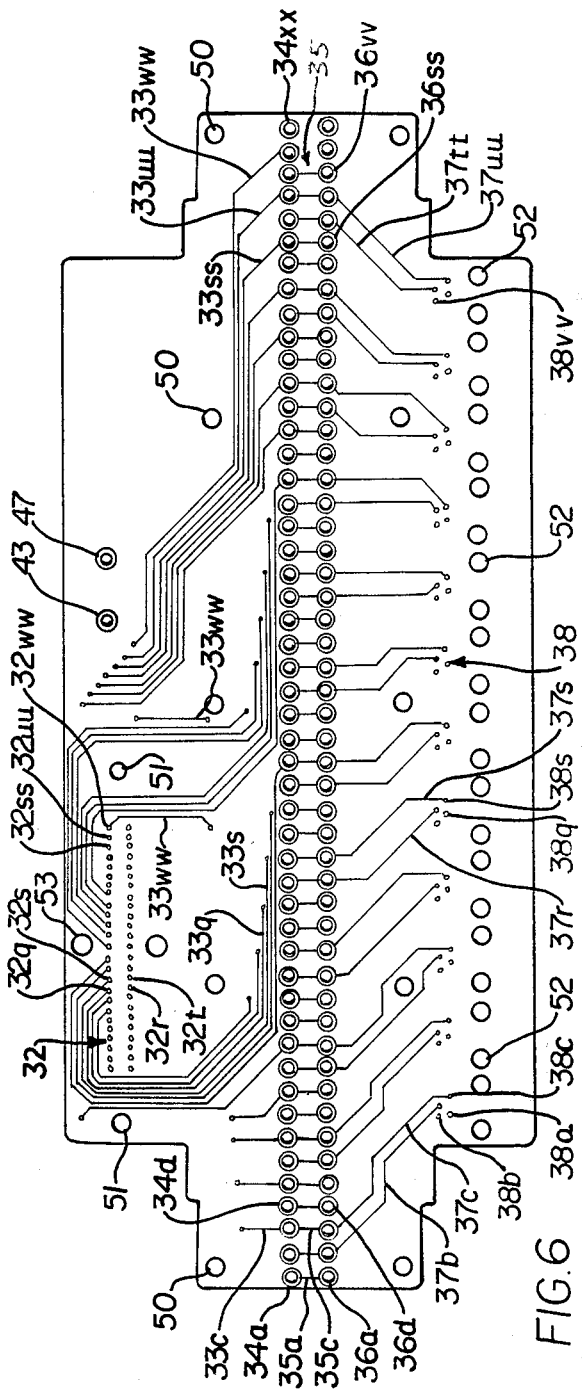
FIG. 5
FIG. 6

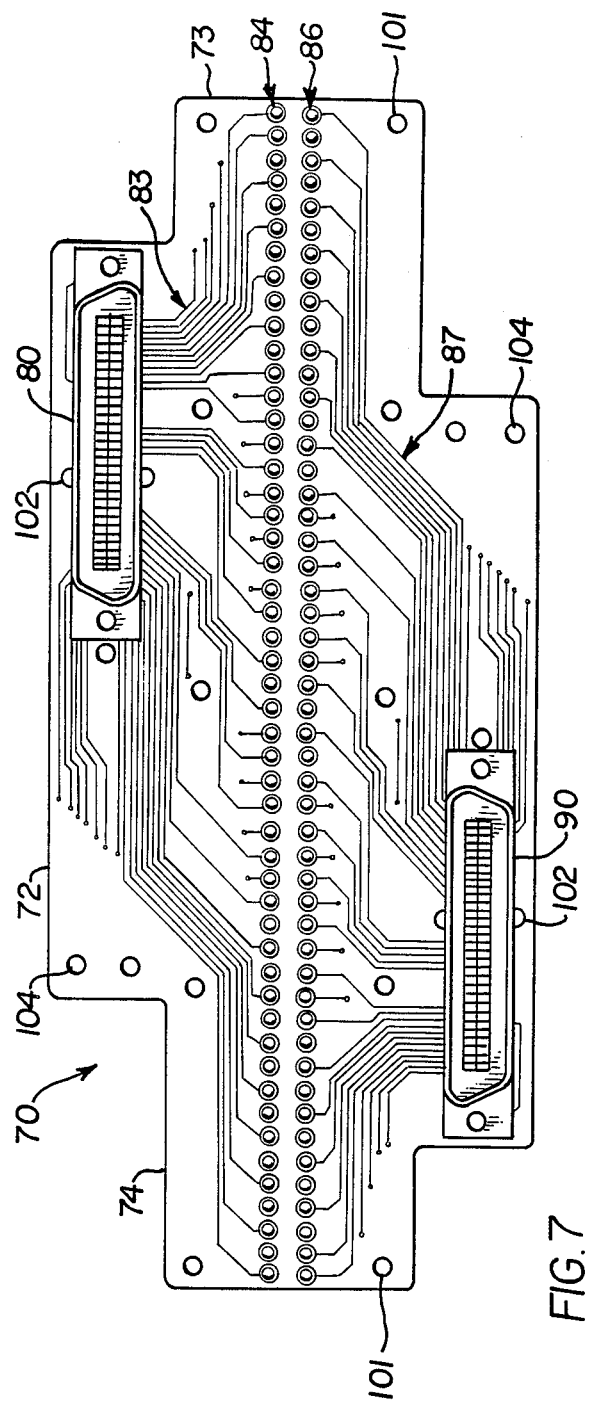
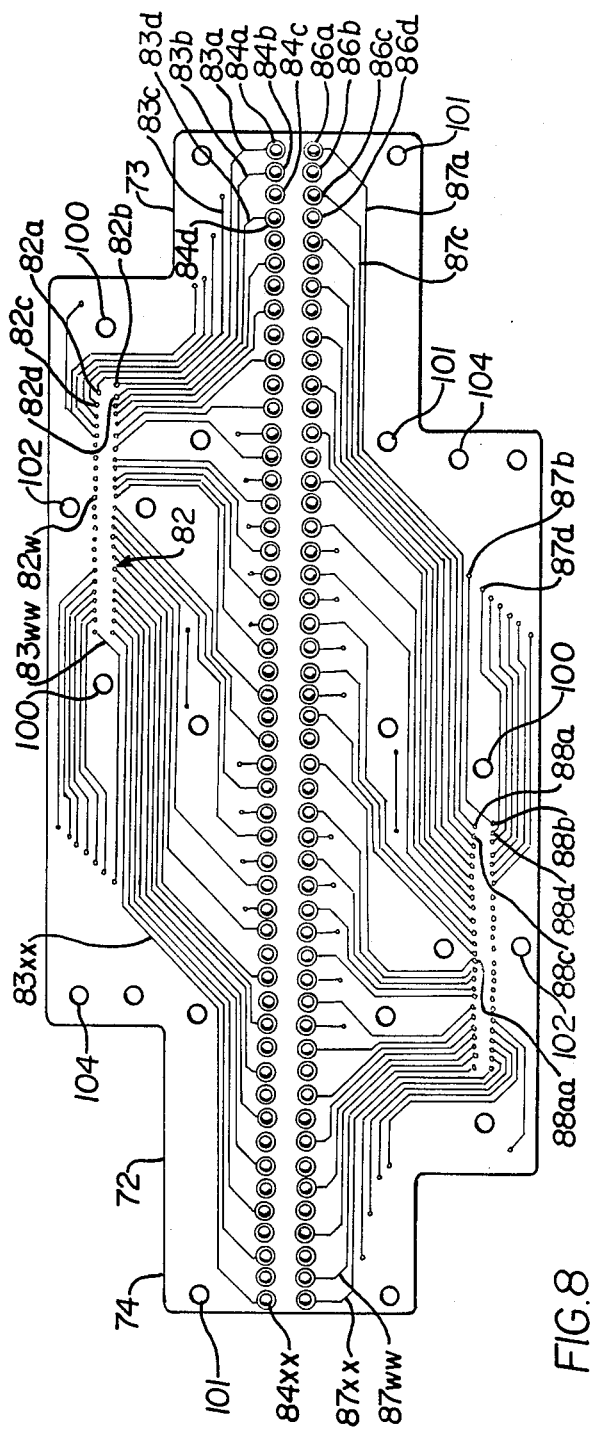
FIG. 7
FIG. 8

PRINTED CIRCUIT BOARD TELEPHONE INTERFACE

BACKGROUND OF THE INVENTION (1) Field of the Invention

This invention relates to a pre-wired terminal connecting block which provides an interface between large numbers of electrically conductive wires in a telecommunication system and, more particularly, to an interface which utilizes a printed circuit board.

(2) Background Art

Under regulations of the United States Federal Communications Commission ("FCC"), each type of telephone circuit must be terminated in a specific interface jack and receptacle. The interface jacks and receptacles are referred to by a particular designation under the Universal Service Order Code ("USOC").

Residential service is provided with the common, modular jacks which have become the standard for connecting all FCC registered telephone equipment. Residences will rarely have more than two telephone lines or circuits. Small businesses may use multiple lines of various types, thereby requiring many separate, small interface jacks or receptacles. Large businesses may additionally require multiple circuit interfaces connected to large capacity interface jacks. Fifty-pin (twenty-five pair) jacks may be used and carry from six to twenty-five circuits each, depending on the number of leads utilized for each circuit. In general, such interfaces require that a multiplicity of incoming telephone lines be routed either to the telephones themselves or to another interface as dictated by the user's particular telephone system arrangement.

A commonly used terminal connecting block is referred to as the "66-type" quick connect block. Such a connecting block includes an upper portion, having a multiplicity of connecting clips, which is supported by a standoff mounting bracket or the like. The various incoming wires may be connected directly to the connecting clips on site in a desired arrangement. In addition, each connecting clip may have a post extending through a rear surface of the block and wires are wire-wrapped to each post in the factory in a desired arrangement. The wires may also extend to standard receptacles carried by the supporting bracket. In this manner, the block may be pre-wired and merely installed on site. Examples of known terminal connecting blocks are shown in U.S. Pat. Nos. Re. 31,714 and 3,836,942.

Such prior art connecting blocks have a number of disadvantages. Manufacture and installation of the blocks are quite labor intensive and time consuming, requiring that a large number of wires (upwards of one-hundred wires or more for each block) be either hand wired to the connecting clips on the block or individually wire-wrapped to the posts beneath the block. In repeatedly connecting such a large number of wires, it is likely that one or more wires will be connected to the wrong location on the terminal block. All of the incoming and outgoing wires are exposed and interwoven, often creating a confusing "rat's nest" of wires. Such exposed wires can easily become unkempt, or disconnected or severed, causing significant maintenance problems. Moreover, since the wires are exposed, it is easy for the interconnections to be tampered with by the customer, an eavesdropper or other unauthorized persons.

SUMMARY OF THE INVENTION

In order to overcome the disadvantages of the prior art, we have invented a pre-wired telephone interface which is easily secured to a telephone mounting bracket. The telephone interface includes a printed circuit board having an outer configuration which is arranged for mounting on a mounting bracket. The interface also includes a first or input telephone receptacle and a second or output telephone receptacle mounted on the printed circuit board and spaced apart from each other. The input and output receptacles each have a plurality of pins connected to corresponding mounting plugs in the printed circuit board. A plurality of electrical traces extend along at least one surface of the printed circuit board and electrically connect the mounting plugs associated with the input receptacle to the mounting plugs associated with the output receptacle. The electrical traces are arranged in a predetermined pattern in which the pins of the input receptacle are connected to the pins of the output receptacle in a predetermined electrical circuit arrangement. Preferably, the input and output receptacles are positioned along opposite edges of the printed circuit board.

The printed circuit board may include a plurality of central mounting plug pairs which are spaced apart from each other, extend along the length of the printed circuit board and are positioned between the input and output receptacles. The electrical traces from the input receptacle extend to the central mounting plugs adjacent the input receptacle and the electrical traces from the output receptacle extend to the central mounting plugs adjacent the output receptacle. Each central mounting plug pair may be electrically connected by a bridging trace extending therebetween along one surface of the printed circuit board, preferably along a lower surface. The telephone interface may include a bridging pin mounted in and electrically connected to each of the central mounting plugs and extending from the printed circuit board. Each adjacent pair of bridging pins is adapted to receive a removable bridging clip and thereby electrically connect a central mounting plug paired together.

The input and output receptacles may each be multi-pin telephone receptacles which are adapted to receive a multi-pin connecting jack. In one embodiment the input receptacle is a fifty-pin receptacle which is adapted to receive a fifty-pin ribbon connecting jack and the output receptacle includes a plurality of four-pin receptacles which are each adapted to receive a four-pin telephone jack. In an alternate embodiment, the output receptacle is also a fifty-pin receptacle.

BRIEF DESCRIPTION OF THE DRAWINGS

FIG. 2 is a perspective view, from another angle, of the interface and bracket shown in FIG. 1;

FIG. 3 is a section taken along lines III—III in FIG. 2;

FIG. 5 is a top view of the printed circuit board in the interface shown in FIG. 4;

FIG. 6 is a bottom view of the printed circuit board shown in FIG. 5;

FIG. 7 is a top view of a second embodiment of a telephone interface in accordance with the present invention;

FIG. 8 is a top view of the printed circuit board in the interface shown in FIG. 7;

DETAILED DESCRIPTION OF THE DRAWINGS

Figure 1:
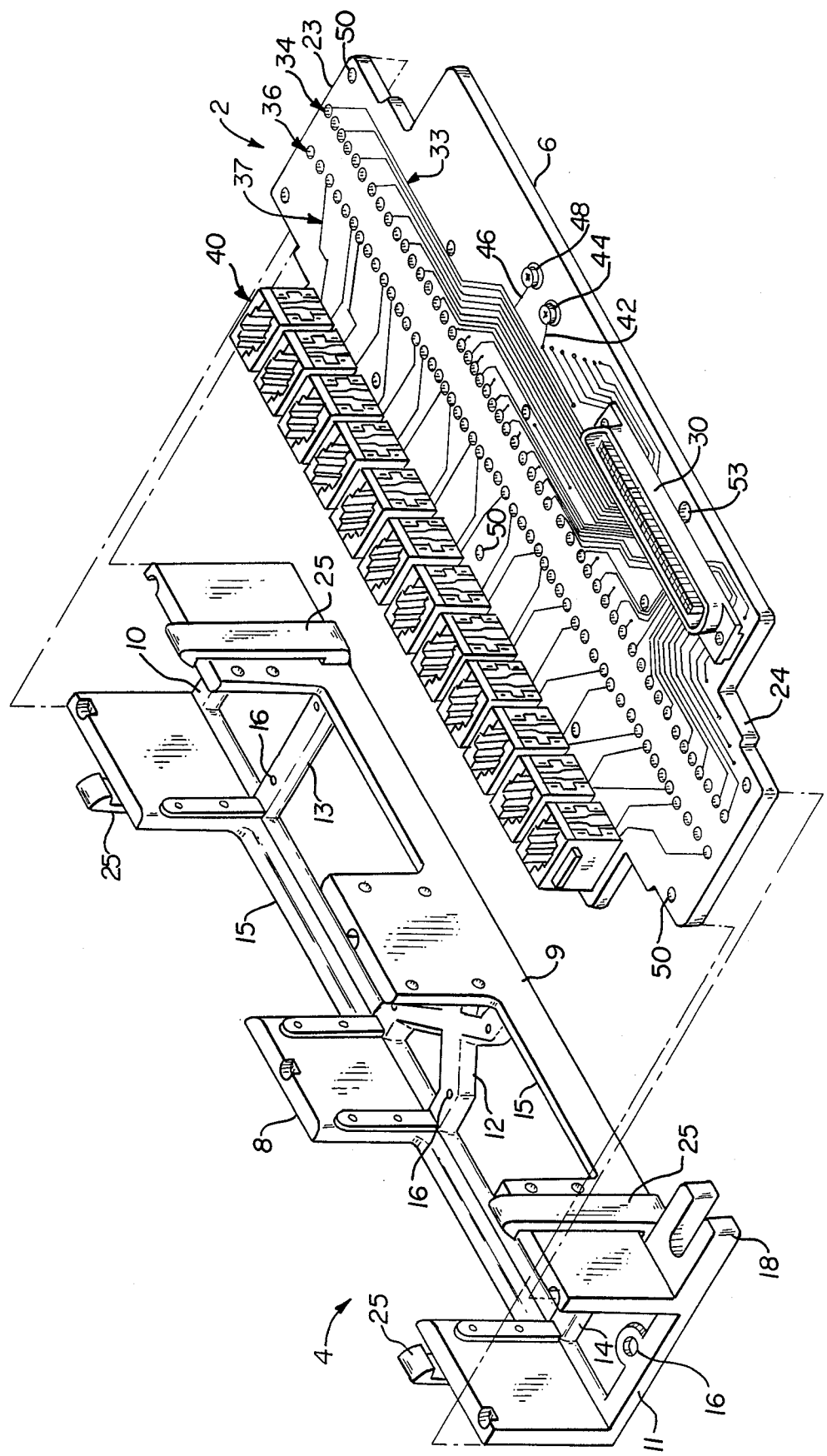
FIG. 1 is an exploded, perspective view of a first embodiment of a telephone interface and mounting bracket in accordance with the present invention.
Figure 4:
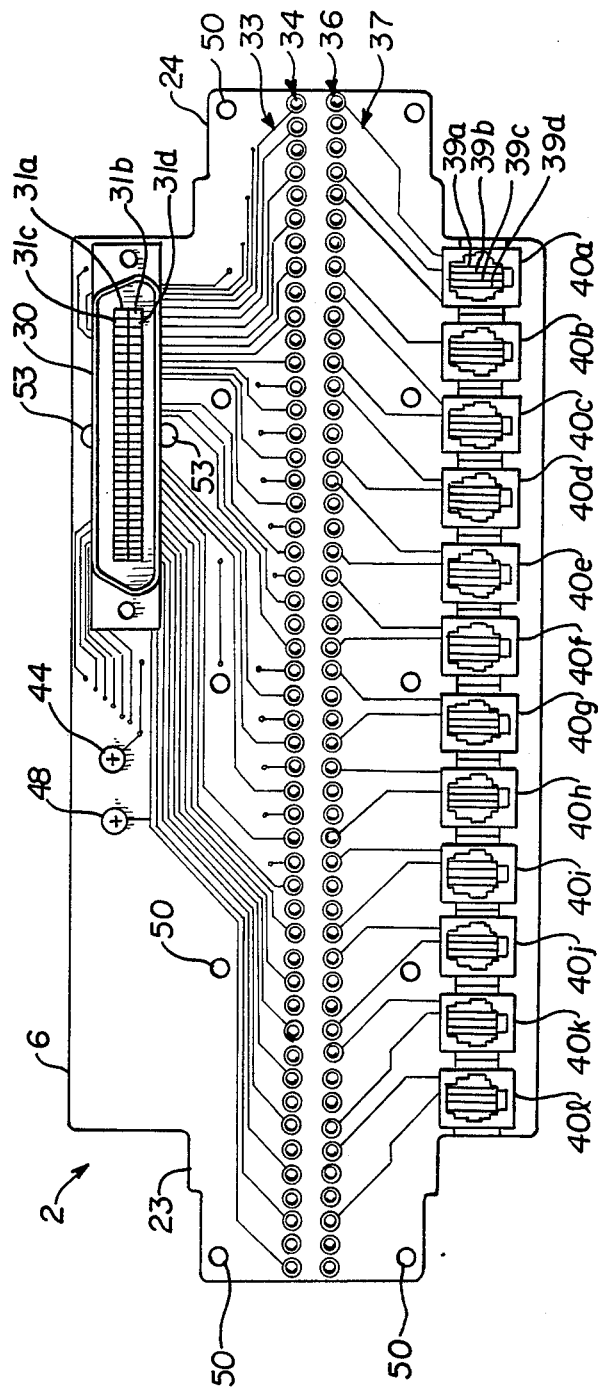
FIG. 4 is a top view of the telephone interface shown in FIG. 1.

Referring now to FIGS. 1-6, there is shown a first embodiment of a pre-wired telephone interface 2 mounted to a standoff telephone mounting bracket 4 in accordance with the present invention. The interface 2 includes printed circuit board 6, preferably planar, which carries a plurality of components on an upper surface thereof. The components are electrically connected together by a plurality of electrical traces on the upper and lower surfaces of the printed circuit board 6 as will be explained hereinafter in more detail.

The mounting bracket 4 includes a pair of elongated side walls 8, 9 which are spaced apart and joined together along a lower edge thereof by end dividers 10, 11, middle divider 12 and bracing dividers 13, 14. The side walls 8, 9 may include one or more elongated recesses 15 to accommodate other receptacles or cables running beneath the interface 2. The bracket 4 may be attached to a support structure, wall or the like by placing a screw or bolt through mounting holes 16 in one or more of the dividers 10-14. Alternately, the bracket 4 may be attached to a support by means of integral mounting ears 18 and 19. One mounting ear 18 is located at the bottom end of side wall 9 adjacent end divider 11. Another mounting ear 19 is located at the bottom end of side wall 8 adjacent end divider 10 and at an opposite end of bracket 4 from mounting ear 18.

The printed circuit board 6 is substantially rectangular in shape and, when mounted to the upper edges of the bracket 4, will preferably extend beyond side walls 8 and 9. Preferably, the printed circuit board 6 terminates at either end in narrow mounting flanges 23, 24 which have an outer configuration conforming to the upper or mounting surface of bracket 4 at each end and, therby, conforming in part to the mounting surface. The bracket 4 has two clamps 25 secured to each side wall 8 and 9. Each clamp 25 includes a base 25a which is integral with the bottom portion of the side walls 8, 9, a leg portion 25b which is spaced apart from side walls 8, 9 and a cap 25c which extends over and is spaced from the top of side walls 8, 9. The clamps 25 are positioned in pairs opposite each other and near the end dividers 10, 11 of the bracket 4. When the interface 2 is positioned on the bracket 4, the cap 25c of each clamp 25 will extend above and securely contact the upper surface of the printed circuit board 6 at the mounting flanges 23, 24. In this manner the clamps 25 securely hold the interface 6 to the bracket 4. The clamps 25 are resilient and by pulling the caps 25c away from the side walls 8, 9, they will disengage from contact with flanges 23, 24 on the printed circuit board 6 and the interface 2 can be easily removed. The caps 25c are sloped downwardly and inwardly, thus enabling the interface 2 to be installed by merely positioning it above the bracket 4, and pushing it downwardly. This will cause the clamp 25 to flex outward as the interface 2 moves along the caps 25c and the clamps 25 will snap over the interface 2 when it moves beyond the bottom of the caps 25c.

The printed circuit board 6 of the interface 2 is formed of a thin, laminated non-conductive substrate made of, for example, phenol paper, epoxy paper or epoxy glass. The printed circuit board 6 carries, preferably on its upper surface, telephone receptacles for providing both an input and an output of a plurality of telephone wires. In the interface 2 shown in FIGS. 1-4, with the printed circuit board 6 shown in more detail in FIGS. 5 and 6, a single input telephone receptacle 30 is mounted along one side of the printed circuit board 6 on an upper surface thereof. Input receptacle 30 has a plurality of conductive input pins 31 which are connected electrically by soldering or the like to corresponding input mounting plugs 32 in the circuit board 6 immediately beneath the input receptacle 30. As is known in the art, mounting plugs in printed circuit boards are generally hollow, cylindrical plugs of electrically conductive material which extend between the upper and lower surfaces of a printed circuit board.

Each of the input mounting plugs 32 is electrically connected by a plurality of input electrical traces 33 to one of a plurality of central input mounting plugs 34 which are disposed along the length of the printed circuit board 6. A plurality of central output mounting plugs 36 are disposed along the length of the printed circuit board 6 and are spaced from and correspond to the central input mounting plugs 34. Together, the central input and output mounting plugs 34, 36 form a plurality of central mounting plug pairs. Each central mounting plug pair 34, 36 may be electrically connected by a bridging trace 35 extending along a surface of the printed circuit board 6. A plurality of output traces 37 electrically connect the central output mounting plugs 36 to a plurality of output mounting plugs 38 positioned in the printed circuit board 6 immediately beneath a telephone output receptacle 40. The telephone output receptacle 40 is mounted to the upper surface of the printed circuit board 6 along a side opposite the telephone input receptacle 30. The output receptacle 40 has a plurality of conductive output pins 39 which are connected electrically by soldering or the like to associated output mounting plugs 38. The input traces 33 and the output traces 37 extend preferably over the upper and lower surfaces of the printed circuit board 6 to electrically connect the input receptacle 30 to the output receptacle 40 in a predetermined electrical circuit arrangement.

In the embodiment shown in FIGS. 1-6, the input receptacle 30 is a fifty-pin receptacle which is adapted to receive a fifty-pin, or twenty-five pair, ribbon connecting jack. Input receptacle 30 is referred to in the trade as an Amphenol TM type of receptacle. Therefore, the input receptacle 30 has fifty corresponding input pins 31, identified by reference numbers 31a, 31b, ... 31z, 31aa, ... 31xx, which mount into separate input mounting plugs 32a, 32b, ... 32xx, respectively, arranged in two columns of twenty-five plugs. The first input plug 32 adjacent the outer edge of the printed circuit board 6 has been identified as element 32a. The input plug 32 immediately to the side of input plug 32a has been identified as element 32b. The input plug 32 immediately beneath input plug 32a has been identified as element 32c. The remaining input plugs 32 have been similarly numbered down the length of the printed circuit board 6. The output receptacle 40 includes twelve, four-pin telephone receptacles, identified as elements 40a, 40b, . . . 40l, which are each adapted to receive a standard, four-pin telephone jack. The output receptacles can be any of the receptacles identified by USOC designations RJ11, RJ12, RJ13, RJ14 and RJ16 which are adapted to receive jacks including up to four wires. The output receptacle 40 includes forty-eight output pins 39a, 39b, . . . 39vv, which mount into separate output mounting plugs 38a, 38b, . . . 38vv, respectively. The output plugs 38 are arranged in lettered groups of four, for example, output plugs 38a–38d carry the output pins 39a–39d for output receptacle 40a, output plugs 38e–38h carry the output pins 39e–39h for output receptacle 40b, and so on. The printed circuit board 6 carries fifty input traces 33a, 33b, . . . 33xx which each extend from an input mounting plug 32 to one of fifty central input mounting plugs 34a, 34b, . . . 34xx. The printed circuit board 6 also carries forty-eight output traces 37a, 37b, . . . 37vv which extend from an output mounting plug 38 to one of forty-eight central output mounting plugs 36a, 36b . . . 36vv. Two additional central output mounting plugs 36ww and 36xx are shown on the printed circuit board 6 but are not connected to any output receptacle 40. The central input and mounting plugs 34, 36 extend along the length of the printed circuit board 6 and are identified by consecutive lettered designations beginning with plugs 34a and 36a at flange 24 and ending with plugs 34xx and 36xx at flange 23. Bridging traces 35a, 35b, . . . 35vv connect the first forty-eight central mounting plug pairs 34a and 36a, 34b and 36b, . . . 34vv and 36vv respectively.

The electrical traces 33, 35 and 36 are disposed along the upper and/or lower surfaces of the printed circuit board 6 in a particular and predetermined pattern which will connect each input pin 31 of the input receptacle 30 to one of the output pins 39 of the output receptacle 40. The particular arrangement selected is determined by the nature and function of the various input wires and the desired function of the output wires in the output receptacle 40. In the arrangement shown in FIGS. 4, 5 and 6, a standard fifty line (twenty-five pair) telephone cable can be connected to the input receptacle 30. These fifty lines are then divided into twelve, four-pin telephone receptacles 40a, 40b, etc. In a typical wiring arrangement, the first four input pins 31a–31d of the input receptacle 30 are connected to the first four output pins 39a–39d of output receptacle 40a. Likewise the second group of four input pins 31e–31h of the input receptacle 30 are connected to the second four output pins 39e–39h of output receptacle 40b. This pattern continues throughout the entire extent of input pins 31 and output pins 39. Since the output pins 39 only require forty-eight pins, the last two input pins 31ww and 31xx will not be connected to any of the output pins 39.

As shown more clearly in FIGS. 5 and 6, input mounting plug 32a is connected by input trace 33a extending along the upper surface of the printed circuit board 6 to central input mounting plug 34a. Bridging trace 35a extends from central input mounting plug 34a to central output mounting plug 36a along the lower surface of the printed circuit board and output trace 37a extends along the upper surface of the printed circuit board 6 to output mounting plug 38a. In a preferred embodiment, all of the adjacent central mounting plugs 34 and 36 are joined by bridging traces 35 extending along a lower surface of the printed circuit board 6.

Input mounting plug 32b is connected to central input mounting plug 34b by input trace 33b extending along the upper surface of the printed circuit board 6. Central output mounting plug 36b is connected to output mounting plug 38b by output trace 37b extending along a lower surface of the printed circuit board 6. Input mounting plug 32c is connected to central input mounting plug 34c by input trace 33c which extends initially along the upper surface of the printed circuit board 6 and then extends through the printed circuit board 6 and continues along the lower surface of the printed circuit board 6 to central input mounting plug 34c. Output trace 37c extends along a lower surface of the printed circuit board 6 from the central output mounting plug 36b to output mounting plug 39c. Finally, input mounting plug 32d is connected to central input mounting plug 34d by input trace 33d extending along an upper surface of the printed circuit board 6, and central output mounting plug 36d is connected to output mounting plug 38d by output trace 37d extending along an upper surface of the printed circuit board 6.

As a further example of the interconnections of the printed circuit board 6 shown in FIGS. 5 and 6, input mounting plugs 32r and 32t are connected to central input mounting plugs 34r and 34t by input traces 33r and 33t, respectively, which extend along an upper surface of the printed circuit board. Input mounting plugs 32q and 32s are connected to central input mounting plugs 34q and 34s by input traces 33q and 33s, respectively, which initially extend along a lower surface of the printed circuit board 6 and then complete their path along an upper surface of the printed circuit board 6. Output mounting plugs 38q and 38t are connected to central output mounting plugs 36q and 36t by output traces 37q and 37t, respectively, which extend along an upper surface of the printed circuit board 6. Output mounting plugs 38r and 38s are connected to central output mounting plugs 36r and 36s by output traces 37r and 37s, respectively, which extend along a lower surface of the printed circuit board 6. As another example, input mounting plugs 32tt and 32vv are connected to central input mounting plugs 34tt and 34vv by input traces 33tt and 33vv, respectively, which extend along an upper surface of the printed circuit board 6. Input mounting plugs 32ss and 32uu are connected to central input mounting plugs 34ss and 34uu by input traces 33ss and 33uu, respectively, which each initially travel along an upper surface of the printed circuit board 6 and then complete their path along a lower surface of the printed circuit board 6. Output plugs 38ss and 38vv are connected to central output mounting plugs 36ss and 36vv by output traces 37ss and 37vv, respectively, which extend along an upper surface of the printed circuit board 6. Output mounting plugs 38tt and 38uu are connected to central output mounting plugs 36tt and 36uu by output traces 37tt and 37uu, respectively, which extend along a lower surface of the printed circuit board 6.

Each of the remaining input mounting plugs 32 will be connected by means of an input trace 33, central input mounting plug 34, bridging trace 35, central output mounting plug 36 and output trace 37 to an output mounting plug 38 along elements having the same lettered subdesignation.

Finally, input mounting plug 32ww is connected to central input mounting plug 34ww by an input trace 33ww which extends initially along the lower surface of the printed circuit board 6, then along its upper surface, lower surface, upper surface, and lower surface in its trace pattern. This is done in order to avoid crossing over one or more input traces 33 which are on either the upper or lower surfaces of the printed circuit board 6. In addition, input trace 33ww is connected by trace 42 to terminal mounting plug 43. Terminal mounting plug 43 can receive screw 44 or the like for making external connections directly to the upper surface of the interface 2. Finally, input mounting plug 32xx is connected to central input mounting plug 34xx by an input trace 33xx which extends along an upper surface of the printed circuit board 6. In addition, input mounting plug 32xx is connected by means of trace 46 to terminal mounting plug 47 which can accept screw 48 or the like. External connections can be made to other devices by connecting a wire to terminal screws 44 or 48, for example, a separate ceiling current circuit can be provided if the telephone system includes an element which requires an external power source.

The printed circuit board 6 shown in FIGS. 5 and 6 also includes a variety of mounting holes to either receive components mounted to the upper surface of the printed circuit board 6 or to permit the interface 2 to be mounted onto a supporting structure or the like. Mounting holes 50 may be used to secure the interface 2 by means of screws, bolts or the like to a supporting surface. Mounting holes 51 are used to secure the input receptacle 30 to the printed circuit board 6. Adjacent pairs of mounting holes 52 are used to mount the output receptacles 40 to the printed circuit board 6. Holes 53 positioned on opposite sides of the input mounting plugs 32, are used to receive a security strap which can pass around a jack plugged into the input receptacle 30 and securely hold it in place. A security strap, made out of metal or the like, is often required by a telephone company to show if a customer or other unauthorized person has tampered with the input connections to the receptacles.

Figure 9:
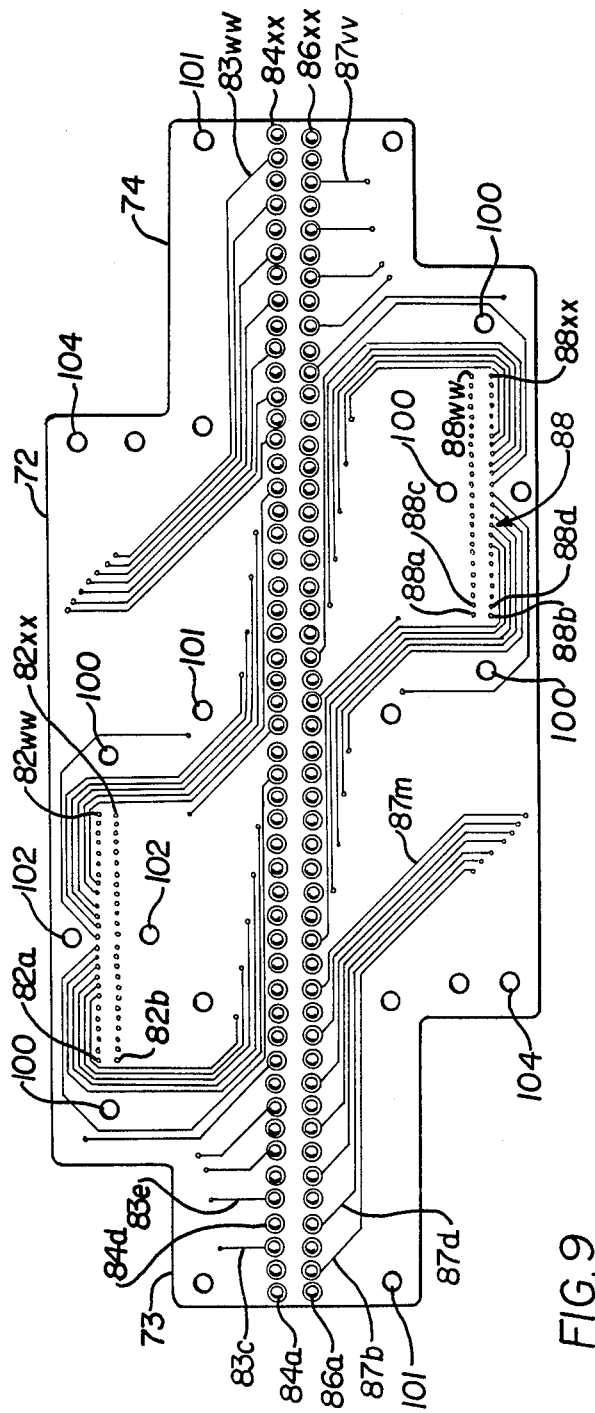
FIG. 9 is a bottom view of the printed circuit board shown in FIG. 8.

A second embodiment of an interface 70 in accordance with the present invention is shown in FIGS. 7–9. This interface 70 has many features common to the interface 2 discussed above in that it is formed of a printed circuit board 72 which has mounting ears 73 and 74 at opposite ends. Interface 70 also includes a single input receptacle 80 which is a fifty-pin telephone receptacle adapted to receive a fifty-pin ribbon connecting jack. Positioned on the opposite side of the printed circuit board 72 from the input receptacle 80 is a single output receptacle 90 which is also a fifty-pin receptacle which is adapted to receive a fifty-pin ribbon connecting jack. As in the embodiment discussed above, the input receptacle 80 is connected by means of a plurality of input pins (not visible in the figures) to a plurality of input mounting plugs 82. Likewise, the output receptacle 90 is connected by means of a plurality of output pins (not visible in the figures) to a plurality of corresponding output mounting plugs 88. The input mounting plugs 82 are connected by means of input traces 83 to central input mounting plugs 84 and the output mounting plugs 88 are connected by means of output traces 87 to central output mounting plugs 86. In this embodiment, there are no bridging traces which connect adjacent pairs of the central input mounting plugs 84, 86. The individual input mounting plugs 82, input traces 83, central input mounting plugs 84, central output mounting plugs 86, output traces 87 and output mounting plugs 88 have been identified by lettered subdesignations a, b, c, . . . ww and xx.

The interface 70 shown in FIGS. 7–9 is used to connect the end of a telephone company-supplied fifty-line cable to a similar fifty-line cable which extends through a user's location. Therefore, it is necessary that the trace patterns on the printed circuit board 72 correctly connect each pin of the input receptacle 80 to the appropriate pin on the output receptacle 90. For example, input mounting plug 82a is connected to central input mounting plug 84a by input trace 83a extending along an upper surface of the printed circuit board 72. Also, output mounting plug 88a is connected to central output mounting plug 86a by output trace 87a extending along the upper surface of the printed circuit board 72. Similarly, input mounting plugs 82b and 82d are connected to central mounting plugs 84b and 84d by means of input traces 83b and 83d, respectively, which extend along the upper surface of the printed circuit board 72. Input mounting plug 82c is connected to central input mounting plug 84c by input trace 83c which initially extends along the upper surface of the printed circuit board 72 and then extends along a lower surface of this printed circuit board 72. Output mounting plug 88c is connected to central output mounting plug 86c by output trace 87c which travels along the upper surface of the printed circuit board 72. Output mounting plugs 88b and 88d are connected to central output mounting plugs 86b and 86d by output traces 87b and 87d, respectively, which initially extend from the central output mounting plugs 86 along a lower surface of the printed circuit board 72 and then extend along the upper surface of the printed circuit board 72. The remaining input mounting plugs 82 are connected by input traces 83 to a corresponding central input mounting plug 84 along a similarly lettered path. In addition, the central output mounting plugs 86 are connected by output traces 87 to corresponding mounting plugs 88 by following similarly lettered paths.

Figure 11:
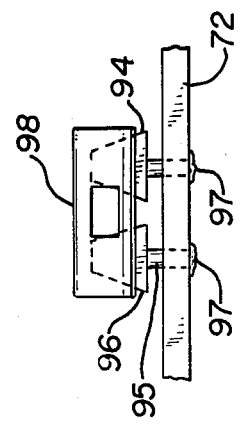
FIG. 11 is an end view of the telephone interface shown in FIG. 10.
Figure 10:
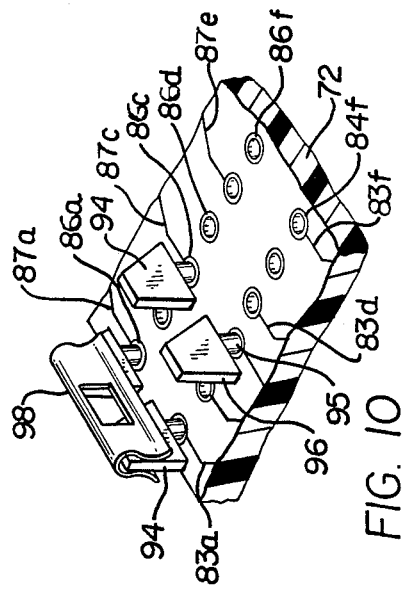
FIG. 10 is a perspective view of a portion of a modification to the telephone interface shown in FIG. 7.

In order to electrically connect the pairs of central input and output mounting plugs 84 and 86, a bridging clip arrangement can be included on the interface 70 as shown in detail in FIGS. 10 and 11. A bridging pin 94 is mounted in and electrically connected to each of the central mounting plugs 84, 86. Each bridging pin 94 includes a cylindrical post 95 and a top portion 96 which tapers as the top extends away from the upper surface of the printed circuit board 72. The post 95 of the bridging pin 94 may be securely fixed to the printed circuit board and electrically connected to the central mounting plugs by solder 97 or the like. The top portions 96 of adjacent bridging pins 94 are spaced apart from and do not contact each other. Adjacent central mounting plug pairs can be connected at the bridging pins 94 by means of a standard, removable bridging clip 98 mounted therebetween. The bridging clip 98 is an elongated, U-shaped conductive member which can be manually positioned over the tops 96 of adjacent pairs of bridging pins 94 and electrically connect the two elements together. In this manner, the final connection between the input receptacle 80 and the output receptacle 90 can be made, and also manually broken if desired by removing the bridging clip 98.

The bridging clip arrangement can also be used in the interface 2 shown in FIGS. 1–6 if the bridging traces 35 are eliminated. Likewise, bridging traces can be used to join the central mounting plug pairs 84, 86 in the interface 70 shown in FIGS. 7–9 rather than use a bridging clip arrangement.

The printed circuit board 72 of the interface 70 shown in FIGS. 7-9 may also include mounting holes 100 for mounting the input and output receptacles 80, 90 thereto. Holes 101 may be used to mount the interface 70 to a wall or other substrate. The printed circuit board 72 may include mounting holes 102 on opposite sides of the input mounting plugs 82 and the output mounting plugs 88 to accommodate a security strap or the like. In addition, the printed circuit board 72 may include an additional set of mounting holes 104 along each side of the printed circuit board adjacent the input and output receptacles 80, 90 which receive a security strap to hold input and output cables down and keep them from moving about when the interface 70 is installed and in place.

The printed circuit boards utilized in the present invention can be produced by any known method such as the print and etch method, the silk screen method or, preferably, the photo-etch method in which artwork corresponding to the final trace pattern is hand drawn, often in an oversized drawing, and transferred to the board with the use of a photoresist composition. The trace pattern extending along the upper and lower surfaces of the printed circuit board is generally a very thin trace made out of a conductive metal such as copper, silver or the like. The traces are also covered with a solder mask layer, generally a semi-transparent, greenish layer, so that the traces will not become contacted by solder when the final solder connection is made to the components mounted to the printed circuit board. In addition, the solder mask layer allows the user to trace the path of the interconnections between the input and output receptacles, but also prevents the user from tampering with the interconnections. The use of printed circuit board wiring also eliminates the possibility of an isolated wiring error from unit to unit.

In addition, other combinations of telephone input and output receptacles could be used in the present invention. For example in the first embodiment, the twelve, four-pin receptacles could be replaced with twenty-five, two-pin receptacles and the trace pattern would be modified accordingly.

Having described above the presently preferred embodiments of the present invention, it is to be understood that it may be otherwise embodied within the scope of the appended claims.

I claim:

1. A pre-wired telephone interface system comprising a telephone interface mounted to a telephone mounting bracket, said telephone interface including a printed circuit board having an outer configuration conforming in part to a mounting surface of said mounting bracket, a first telephone receptacle and a second telephone receptacle mounted on said printed board and spaced apart from each other, said telephone receptacles each having a plurality of pins electrically connected to corresponding mounting plugs of said printed circuit board, and a plurality of electrical traces extending along at least one surface of said printed surface board and electrically connecting mounting plugs associated with said first telephone receptacle to mounting plugs associated with said second telephone receptacle, with the electrical traces arranged in a predetermined pattern whereby the pins of said first telephone receptacle are connected to the pins of said second telephone receptacle in a predetermined electrical circuit arrangement.

2. The telephone interface system of claim 1 wherein said first telephone receptacle is positioned along one edge of said printed circuit board and said second telephone receptacle is positioned along an opposite edge of said printed circuit board.

3. The telephone interface system of claim 1 wherein said first and second telephone receptacles are each multi-pin receptacles which are adapted to receive a multi-pin ribbon connecting jack.

4. The telephone interface system of claim 1 wherein said first and second telephone receptacles are each fifty-pin receptacles which are adapted to receive a fifty-pin ribbon connecting jack.

5. The telephone interface system of claim 1 wherein said printed circuit board includes a plurality of central mounting plug pairs which are spaced apart from each other, extend along the length of said printed circuit board and are disposed between said first and second telephone receptacles.

6. The telephone interface system of claim 5 further including a bridging pin mounted in and electrically connected to each of said central mounting plugs and extending from an upper surface of said printed circuit board, with each adjacent pair of bridging pins adapted to receive a removable bridging clip and thereby electrically connect a central mounting plug pair together.

7. The telephone interface system of claim 5 wherein the electrical traces from said first telephone receptacle each extend to one of said central mounting plugs adjacent said first telephone receptacle and the electrical traces from said second telephone receptacle each extend to one of said central mounting plugs adjacent said second telephone receptacle.

8. The telephone interface system of claim 7 wherein each central mounting plug pair is electrically connected by a bridging electrical trace extending therebetween along a surface of said printed circuit board.

9. The telephone interface system of claim 8 wherein said bridging electrical traces extend along a lower surface of said printed circuit board.

10. The telephone interface system of claim 1 wherein said first telephone receptacle is a multi-pin receptacle which is adapted to receive a multi-pin ribbon connecting jack and said second telephone receptacle includes a plurality of multi-pin receptacles which pare each adapted to receive a multi-pin telephone jack.

11. The telephone interface system of claim 10 wherein said first telephone receptacle is a fifty-pin receptacle which is adapted to receive a fifty-pin ribbon connecting jack.

12. The telephone interface system of claim 11 wherein said second telephone receptacle includes up to twelve, four-pin telephone receptacles which are each adapted to receive a four-pin telephone jack.

13. The telephone interface system of claim 12 wherein up to two electrical traces from the mounting plugs associated with said first telephone receptacle each terminate in an electrical connector at one surface of said printed circuit board.

14. A pre-wired telephone interface capable of being secured to a telephone mounting bracket, said telephone interface comprising:
 a printed circuit board having an outer configuration which is arranged for mounting on said mounting bracket;
 a first telephone receptacle and a second telephone receptacle mounted on said printed circuit board and spaced apart from each other, said telephone receptacles each having a plurality of pins electrically connected to corresponding mounting plugs of said printed circuit board; and a plurality of electrical traces extending along at least one surface of said printed circuit board and electrically connecting the mounting plugs associated with said first telephone receptacle to mounting plugs associated with said second telephone receptacle, with the electrical traces arranged in a predetermined pattern whereby the pins of said first telephone receptacle are connected to the pins of said second telephone receptacle in a predetermined electrical circuit arrangement, with said printed circuit board including a plurality of central mounting plug pairs which are spaced apart from each other, extend along the length of said printed circuit board and are disposed between said first and second telephone receptacles, with the electrical traces from said first telephone receptacle each extending to one of said central mounting plugs adjacent said first telephone receptacle and the electrical traces from said second telephone receptacle each extending to one of said central mounting plugs adjacent said second telephone receptacle, and with each central mounting plug pair electrically connected by a bridging electrical trace extending therebetween along a surface of said printed circuit board.

15. The telephone interface of claim 14 wherein said first telephone receptacle is positioned along one edge of said printed circuit board and said second telephone receptacle is positioned along an opposite edge of said printed circuit board.

16. The telephone interface of claim 14 wherein said bridging electrical traces extend along a lower surface of said printed circuit board.

17. The telephone interface of claim 14 further including a bridging pin mounted in and electrically connected to each of said central mounting plugs and extending from an upper surface of said printed circuit board, with each adjacent pair of bridging pins adapted to receive a removable bridging clip and thereby electrically connect a central mounting plug pair together.

18. The telephone interface of claim 14 wherein said first and second telephone receptacles are each multi-pin receptacles which are adapted to receive a multi-pin ribbon connecting jack.

19. The telephone interface of claim 14 wherein said first and second telephone receptacles are each fifty-pin receptacles which are adapted to receive a fifty-pin ribbon connecting jack.

20. The telephone interface of claim 14 wherein said first telephone receptacle is a multi-pin receptacle which is adapted to receive a multi-pin ribbon connecting jack and said second telephone receptacle includes a plurality of multi-pin receptacles which are each adapted to receive a multi-pin telephone jack.

21. The telephone interface of claim 14 wherein said first telephone receptacle is a fifty-pin receptacle which is adapted to receive a fifty-pin ribbon connecting jack.

22. The telephone interface of claim 21 wherein said second telephone receptacle includes up to twelve, four-pin telephone receptacles which are each adapted to receive a four-pin telephone jack.

23. The telephone interface of claim 22 wherein up to two electrical traces from the mounting plugs associated with said first telephone receptacle each terminate in an electrical connector at one surface of said printed circuit board.

24. A pre-wired telephone interface capable of being secured to a telephone mounting bracket, said telephone interface comprising:

a printed circuit board having an outer configuration which is arranged for mounting on said mounting bracket;

a first telephone receptacle and a second telephone receptacle mounted on said printed circuit board and spaced apart from each other, said telephone receptacles each having a plurality of pins electrically connected to corresponding mounting plugs of said printed circuit board;

a plurality of electrical traces extending along at least one surface of said printed circuit board and electrically connecting the mounting plugs associated with said first telephone receptacle to mounting plugs associated with said second telephone receptacle, with the electrical traces arranged in a predetermined pattern whereby the pins of said first telephone receptacle are connected to the pins of said second telephone receptacle in a predetermined electrical circuit arrangement, said printed circuit board including a plurality of central mounting plug pairs which are spaced apart from each other, extend along the length of said printed circuit board and are disposed between said first and second telephone receptacles, and a bridging pin mounted in and electrically connected to each of said central mounting plugs and extending from an upper surface of said printed circuit board, with each adjacent pair of bridging pins adapted to receive a removable bridging clip and thereby electrically connect a central mounting plug pair together.

25. The telephone interface of claim 24 wherein said first telephone receptacle is positioned along one edge of said printed circuit board and said second telephone receptacle is positioned along an opposite edge of said printed circuit board.

26. The telephone interface of claim 24 wherein said first and second telephone receptacles are each multi-pin receptacles which are adapted to receive a multi-pin ribbon connecting jack.

27. The telephone interface of claim 24 wherein said first and second telephone receptacles are each fifty-pin receptacles which are adapted to receive a fifty-pin ribbon connecting jack.

28. The telephone interface of claim 24 wherein said first telephone receptacle is a multi-pin receptacle which is adapted to receive a multi-pin ribbon connecting jack and said second telephone receptacle includes a plurality of multi-pin receptacles which are each adapted to receive a multi-pin telephone jack.

29. The telephone interface of claim 24 wherein the electrical traces from said first telephone receptacle each extend to one of said central mounting plugs adjacent said first telephone receptacle and the electrical traces from said second telephone receptacle each extend to one of said central mounting plugs adjacent said second telephone receptacle.

30. The telephone interface of claim 29 wherein each central mounting plug pair is electrically connected by a bridging electrical trace extending therebetween along a surface of said printed circuit board.

31. The telephone interface of claim 30 wherein said bridging electrical traces extend along a lower surface of said printed circuit board.

32. The telephone interface of claim 24 wherein said first telephone receptacle is a fifty-pin receptacle which is adapted to receive a fifty-pin ribbon connecting jack.

33. The telephone interface of claim 32 wherein said second telephone receptacle includes up to twelve, four-pin telephone receptacles which are each adapted to receive a four-pin telephone jack.

34. The telephone interface of claim 33 wherein up to two electrical traces from the mounting plugs associated with said first telephone receptacle each terminate in an electrical connector at one surface of said printed circuit board.

35. A pre-wired telephone interface capable of being secured to a telephone mounting bracket, said telephone interface comprising:
   a printed circuit board having an outer configuration which is arranged for mounting on said mounting bracket;
   a first telephone receptacle and a second telephone receptacle mounted on said printed circuit board and spaced apart from each other, said telephone receptacles each having a plurality of pins electrically connected to corresponding mounting plugs of said printed circuit board, with said first telephone receptacle being a fifty-pin receptacle which is adapted to receive a fifty-pin ribbon connecting jack and with said second telephone receptacle including up to twelve, four-pin telephone receptacles which are each adapted to receive a four-pin telephone jack; and
   a plurality of electrical traces extending along at least one surface of said printed circuit board and electrically connecting the mounting plugs associated with said first telephone receptacle to mounting plugs associated with said second telephone receptacle, with the electrical traces arranged in a predetermined pattern whereby the pins of said first telephone receptacle are connected to the pins of said second telephone receptacle in a predetermined electrical circuit arrangement, and with up to two electrical traces from the mounting plugs associated with said first telephone receptacle each terminating in an electrical connector at one surface of said printed circuit board.

* * * * *